United States Patent [19]

Ohsawa

[11] Patent Number: 5,540,098
[45] Date of Patent: Jul. 30, 1996

[54] TRANSFER DEVICE

[75] Inventor: Tetsu Ohsawa, Sagamihara, Japan

[73] Assignees: Tokyo Electron Limited, Tokyo; Tokyo Electron Tohoku Limited, Esashi, both of Japan

[21] Appl. No.: 197,283

[22] Filed: Feb. 16, 1994

[30] Foreign Application Priority Data

Feb. 16, 1993 [JP] Japan .................................. 5-050225

[51] Int. Cl.⁶ .......................... G01N 29/20; G01N 29/22
[52] U.S. Cl. ........................ 73/629; 73/634; 73/432.1; 367/93; 367/97; 367/105; 437/247
[58] Field of Search ...................... 73/599, 600, 609, 73/629, DIG. 1, 627, 646, 432.1; 437/247; 248/682, 550, 913

[56] References Cited

U.S. PATENT DOCUMENTS

| 3,737,282 | 6/1973 | Hearn et al. ........................... 437/247 |
| 3,960,007 | 6/1976 | Swensen .................................. 73/629 |
| 4,175,441 | 11/1979 | Urbanek et al. ........................ 73/599 |
| 4,276,621 | 6/1981 | Hiruma et al. ............................ 367/97 |
| 4,627,291 | 12/1986 | Otsuki et al. ............................. 73/634 |
| 5,048,164 | 9/1991 | Harima ................................... 437/247 |
| 5,177,711 | 1/1993 | Yamaguchi et al. .................... 367/105 |
| 5,231,608 | 7/1993 | Matsui .................................... 367/93 |

FOREIGN PATENT DOCUMENTS

| 63-180824 | 7/1988 | Japan . |
| 4-75362 | 3/1992 | Japan . |

*Primary Examiner*—Hezron E. Williams
*Assistant Examiner*—Rose M. Finley
*Attorney, Agent, or Firm*—Oblon, Spivak, McClelland, Maier, & Neustadt

[57] ABSTRACT

A transfer device an ultrasonic sensor having an oscillating section for oscillating an ultrasonic beam toward wafers which are horizontally arranged in a carrier and a receiving section for receiving a reflected ultrasonic wave, and driving mechanism for vertically moving the ultrasonic sensor relative to the carrier so as to sequentially radiate an ultrasonic beam to the end faces of the wafers. The presence/absence of a wafer and projection of the wafer in and from the carrier are detected based on the reflected wave received by the receiving section.

7 Claims, 4 Drawing Sheets

TRANSFER DEVICE

BACKGROUND OF THE INVENTION

1. Field of the Invention

The present invention relates to a transfer device for a plate-like transfer target, e.g., a semiconductor wafer, which is used in, e.g., a semiconductor manufacturing process.

2. Description of the Related Art

In a semiconductor manufacturing system, wafers are transferred among process stations and stored while they are housed in a container (usually called a "carrier" or "cassette") made of, e.g., Teflon, and having upper and lower open ends and many slots. At the process stations, a container (to be referred to as a "carrier" hereinafter), in which, e.g., 25 wafers are housed parallel to each other with predetermined gaps while they are supported in slots, is loaded on an unloading/loading boat. Then, at this position or after the carrier is moved to another place, the wafers in the carrier are sequentially transferred by a wafer transfer device to a predetermined place, e.g., a wafer boat (in annealing) or a load-lock chamber (in vacuum processing).

To transfer the wafers in this manner, while the carrier is set upright, i.e., while the wafers are arranged horizontally, the fork of the transfer device is inserted in each slot through an opening in the front wall of the carrier, and each wafer is taken up by the fork. In this case, the wafers must be accurately housed in the carrier. However, when the carrier is placed on a carrier stage, the wafers sometimes partly project from the opening of the carrier due to the impact of placing the carrier on the carrier stage. For example, if a wafer is tilted in the slot and is thus held unstably, this wafer particularly tends to project. If the carrier is left on the carrier stage for a long period of time, some wafers sometimes project from the carrier due to the vibration caused by an air-blowing fan or the like.

When a wafer projects from the carrier, since the fork of the wafer transfer device takes up a portion of the wafer dislocated from a predetermined position, the wafer sometimes drops from the fork at this time. A dropped wafer cannot be used as a product. If a wafer is damaged, fragments are scattered and cumbersome cleaning becomes necessary. In addition, the manufacture line is stopped, and the entire throughput decreases.

Even if a wafer does not drop from the fork, when, e.g., wafers are to be transferred to groove portions between the pillars of the wafer boat of an annealing device, as the holding region of each groove portion is narrow, a wafer sometimes drops during transfer from the fork to the wafer boat. Accordingly, in order to transfer wafers with a high reliability, projection of a wafer in the carrier must be detected, and upon detecting projection of a wafer, the transfer device must be stopped immediately, and this fact must be informed to the operator.

Furthermore, when wafers are to be taken out from the carrier, in addition to projection of a wafer, the presence/absence of a wafer at each stage (each slot) in the carrier must be detected. More specifically, a predetermined number of wafers may not always be conveyed to a process station while they are housed in a carrier with a predetermined order. Sometimes an accident may happen at a process station of a previous stage, or a testing wafer may be pulled out from the carrier in order to perform inspection of the process of a previous stage. If there is a stage in the carrier in which a wafer is absent in this manner, the system controller must obtain information as to stages in which wafers are present and those in which wafers are absent, and must inform this information to the wafer transfer device.

As a technique for detecting the housing state of wafers in the carrier as described above, a technique as disclosed in, e.g., Jpn. Pat. Appln. KOKAI Publication No. 4-75362 is known. According to this technique, light-emitting and light-receiving elements are arranged above and below a carrier so as to form an optical path at a position opposing the opening in the front wall of the carrier placed on a carrier stage. When a wafer blocks the optical path, it is determined that a wafer projects. At the same time, light-emitting and light-receiving elements are arranged in front of and behind the carrier. When the optical path is blocked upon vertically moving the carrier stage, it is determined that a wafer is present at a stage that blocks the optical path.

In the above detection unit, in order to detect projection of a wafer, the light-emitting and light-receiving elements are arranged to vertically sandwich the carrier and, in order to detect the presence/absence of a wafer, the light-emitting and light-receiving elements are arranged to horizontally sandwich the carrier. Therefore, a space necessary for arranging the carrier becomes undesirably large.

Furthermore, since the thickness of a wafer as a detection target is as small as about 0.7 mm, the heights of the optical axes of the light-emitting and light-receiving elements must be adjusted to coincide within this small allowable range, and it is difficult to adjust these heights.

SUMMARY OF THE INVENTION

It is an object of the present invention to provide a transfer device capable of reliably detecting the presence/absence and/or projection of a plate-like transfer target in each stage in a container and requiring a small space.

According to an aspect of the present invention, there is provided a transfer device comprising: means for holding a plurality of plate-like transfer targets each having one end face facing in the same direction by disposing the transfer targets with predetermined gaps between each other in a direction of the end face; an ultrasonic sensor having an oscillating section for oscillating an ultrasonic beam toward the holding means and a receiving section for receiving a reflected ultrasonic wave; driving means for moving the ultrasonic sensor relative to the holding means in a direction along which the transfer targets are disposed so as to radiate an ultrasonic beam to the end faces of the transfer targets; and means for detecting at least one of the presence/absence of a transfer target and projection of the transfer target in and from the holding means based on the reflected wave received by the receiving section.

In the transfer device having the above arrangement, the ultrasonic oscillating section is positioned to oppose the front surface of the container. When the ultrasonic oscillating section oscillates an ultrasonic wave forward from this position, if a transfer target is positioned in the radiated direction of the ultrasonic wave, the ultrasonic wave is reflected by the end face of the transfer target, and the reflected wave is received by the receiving section. If a transfer target is absent, a reflected wave reflected by a device body storing a transfer device and located behind the container is received through the rear wall or an opening formed in the rear wall of the container (if a reflecting object is absent behind the container, a reflected wave is not detected). Accordingly, the presence/absence of the transfer target can be detected by monitoring a signal received by the receiving section.

Whether or not a transfer target is located on a side closer to the transfer section side than a predetermined position is obtained by detecting the intensity or reflection time of the received reflected wave. Then, when the transfer section is moved, e.g., downward at a position opposing the front surface of the container, the presence/absence and/or projection of a transfer target in each stage in the container can be detected based on the height information of the transfer section and the reception signal from the receiving section.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENT

A transfer device according to an embodiment of the present invention will be described with reference to the accompanying drawings.

Figure 1:
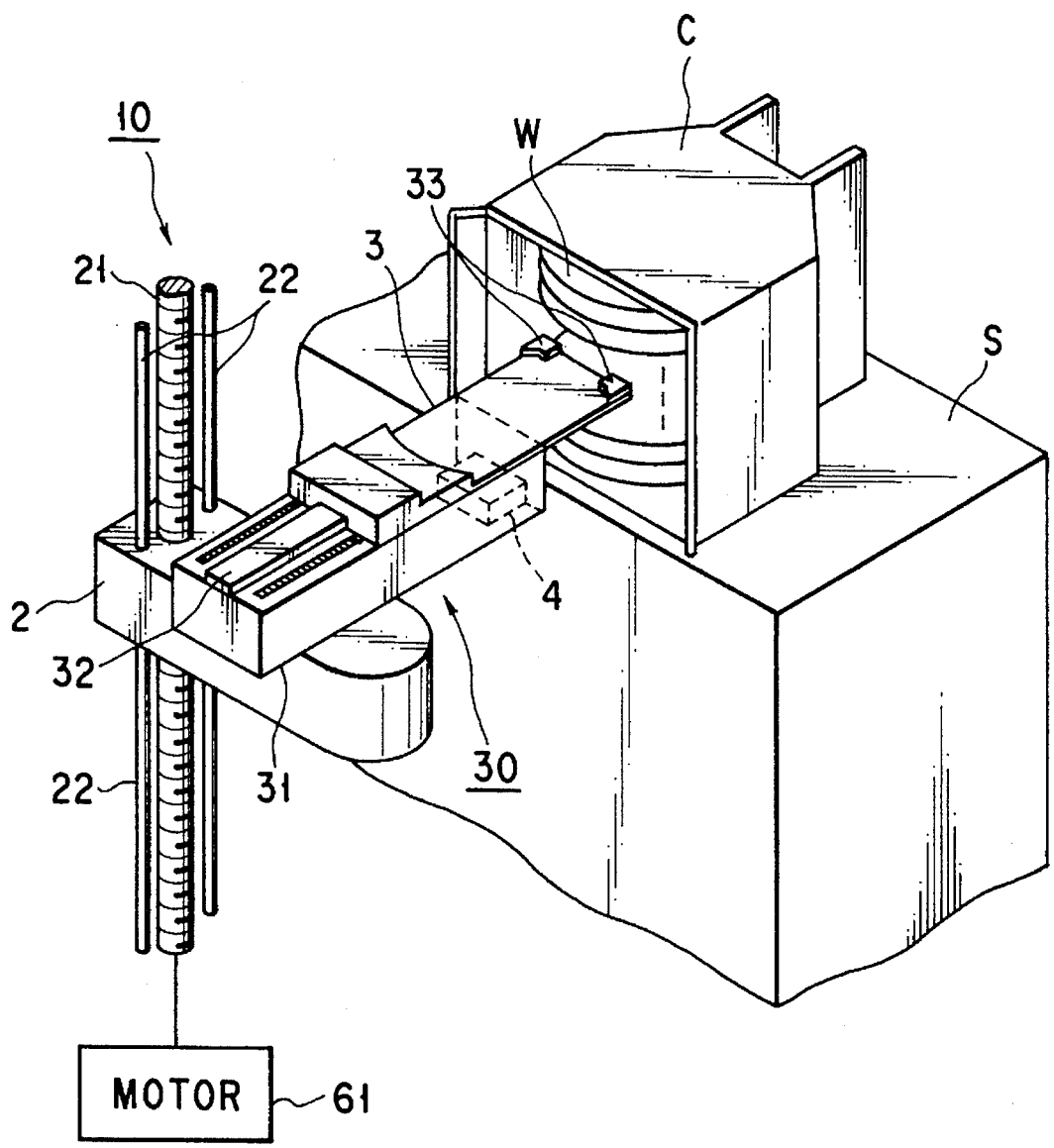
FIG. 1 is a perspective view schematically showing a transfer device according to an embodiment of the present invention.

FIG. 1 is a perspective view showing a state wherein a wafer transfer device according to the embodiment of the present invention opposes a carrier stage. This transfer device 10 has an elevating table 2, a rotating table 31, and a fork 3 serving as a holding member that can move forward and backward. The elevating table 2 is threadably mounted on a ball screw 21 which extends in the vertical direction and is rotatably mounted on a main body (not shown.) Two vertical guide rods 22 fixed to the main body extend vertically through the elevating table 2. Accordingly, when the ball screw 21 is rotated by a motor 61, the elevating table 2 is continuously or intermittently moved vertically while it is guided by the guide rods 22.

The rotating table 31 is provided on the elevating table 2 to be rotatable in a θ direction, i.e., about a vertical axis, in a horizontal plane. The fork 3 can move forward/backward on the rotating table 31 as it is guided by a pair of guide rails 32 provided on the rotating table 31. The fork 3 has guide portions 33 having steps with respect to its wafer holding surface in order to guide the periphery of a wafer (to be described later). The rotation of the rotating table 31 and the forward/backward movement of the fork 3 are executed by motors 62, 63 (to be described later).

In this embodiment, the elevating table 2, the rotating table 31, and the fork 3 constitute a transfer mechanism 30. An ultrasonic sensor 4 (to be described later) is mounted to the transfer mechanism 30, e.g., the front end portion of the rotating table 31. As shown in FIG. 1, a carrier (container) C is placed on a placing section, e.g., a carrier stage S, to oppose the front surface of the transfer mechanism 30. The carrier C can house a maximum of 25 plate-like transfer targets, e.g., semiconductor wafers, by holding them parallel to each other with predetermined gaps between them in the direction of thickness. The carrier C has openings in its transfer mechanism 30 side or the rear side, and the front side, and the wafers can be taken out through the opening in the rear side. Twenty-five slits extend horizontally in each of the inner surfaces of the two sides of the carrier C with predetermined gaps in the vertical direction. When the two side portions of a wafer are inserted in a pair of slits (defining each slot or stage), the wafer is held while exposing its one end face through the corresponding opening.

Figure 2:
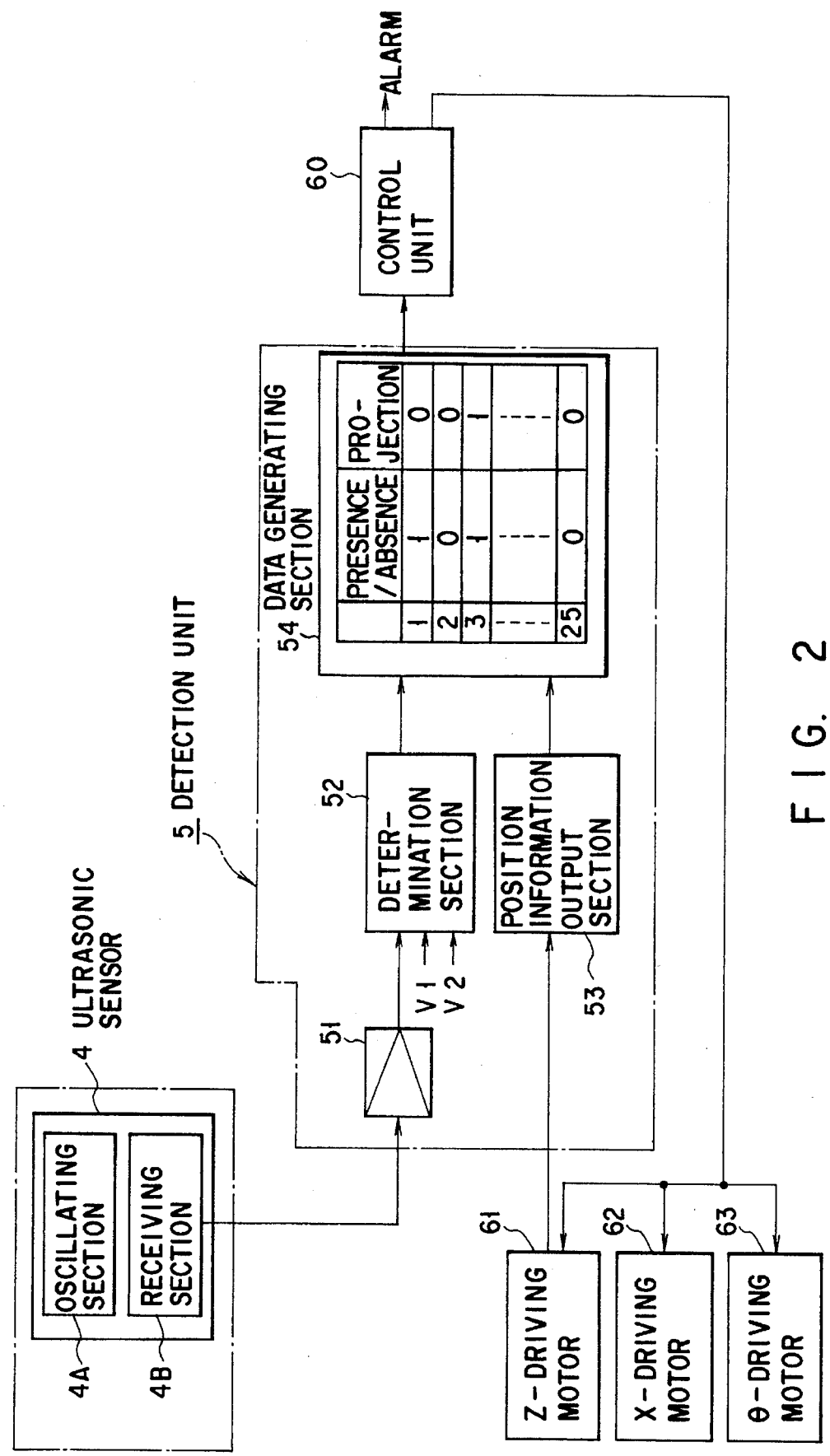
FIG. 2 is a circuit diagram of the control mechanism of the transfer device of this embodiment.

As shown in FIG. 2, the ultrasonic sensor 4 comprises, e.g., an ultrasonic oscillating section (to be referred to as an "oscillating section" hereinafter) 4A and an ultrasonic receiving section (to be referred to as a "receiving section" hereinafter) 4B. The oscillating section 4A oscillates an ultrasonic wave forward (in a forward-movement direction of the fork 3). Upon reception of a reflected ultrasonic wave, the receiving section 4B outputs an electric signal which provides distance information obtained from the time or magnitude difference between the oscillated and received ultrasonic waves. The receiving section 4B is connected to a detection unit 5 for detecting the presence/absence and projection of a wafer w in each stage in the carrier C. For example, an E4DA type ultrasonic displacement sensor manufactured by OMRON Co., Ltd. can be employed as such an ultrasonic sensor. This sensor employs the FM-chirp scheme in which the frequency of a transmission wave is periodically changed and the distance to a transfer target is measured from a difference in magnitude between the transmission wave and a reception wave. Hence, this sensor has a high response speed of 2 ms.

The detection unit 5 has an amplifier 51, a determination section 52, a position information output section 53, and a data generating section 54. The amplifier 51 is connected to the output of the receiving section 4B and amplifies an electric signal from the receiving section 4B. The determination section 52 is connected to the output stage of the amplifier 51. The position information output section 53 outputs position information corresponding to the height of the transfer mechanism 30 (the height of the fork 3), i.e., slot information. The data generating section 54 generates data describing the presence/absence and projection of a wafer W in units of slot numbers in the carrier C based on output signals from the determination section 52 and the position information output section 53.

The determination section 52 has a function of comparing the voltage level of a signal from the amplifier 51 with first and second thresholds V1 and V2 (to be described later) that are different from each other. When a wafer W is housed in a given slot of the carrier C, an ultrasonic wave oscillated by the oscillating section 4A is reflected by the rear end face of this wafer. This reflected wave is received by the receiving section 4B, and a voltage signal V is output from the receiving section 4B through the amplifier 51. The first threshold V1 is set to a level slightly lower than the output voltage level V of the amplifier 51 obtained at this time and higher than an output voltage level V3 of the amplifier 51 obtained when a wafer W is absent.

When a case wherein a wafer W is correctly housed in the carrier C without projecting from it and a case wherein a wafer W projects from the carrier C are compared, the output voltage level of the amplifier 51 is higher in the latter case since the distance between the ultrasonic sensor 4 and the wafer W is shorter in this latter case. Accordingly, the second threshold V2 is set to a voltage level corresponding to a predetermined projecting distance, i.e., a level slightly higher than the voltage signal V.

Thus, the input voltage of the determination section 52 has a level lower than V1 when the wafer W is absent in the corresponding slot in the carrier C, has an intermediate level between V1 and V2 when the wafer W is correctly (without projection) housed, and has a level higher than V2 when the wafer W projects. Hence, the determination section 52 outputs a signal corresponding to the presence/absence and projection of the wafer W by comparing the input voltage level with V1 and V2.

The position information output section 53 fetches a driving amount, which is supplied from the motor 61 for driving the ball screw 21 that vertically moves the transfer mechanism 30, through an encoder (not shown), calculates the height of the fork 3 in the carrier C in the form of a slot number, and outputs position information corresponding to the slot number.

A control unit 60 is provided at the output stage of the data generating section 54. The control unit 60 accesses data in the data generating section 54 and supplies control signals to the Z-driving motor 61, X-driving motor 62 for driving the fork 3, θ-driving motor 63 for driving the rotating table 31 in the θ direction. When this data includes data indicating projection of a wafer W, the control unit 60 prohibits output of the control signals in order to stop the transfer mechanism 30, and outputs an alarm signal. When, however, the determination section 52 recognizes that a wafer W projects, the system may be stopped immediately in an interlocked manner.

The operation of the transfer device of this embodiment will be described.

The carrier C housing wafers W is placed on the carrier stage S. The rotating table 31 is rotated until the fork 3 of the transfer device 10 opposes the front surface of the carrier C. The ball screw 21 is driven to move the transfer mechanism 30 downward, so that the ultrasonic sensor 4 is continuously moved from above the uppermost slot to below the lowermost slot of the carrier C.

Figure 3B:
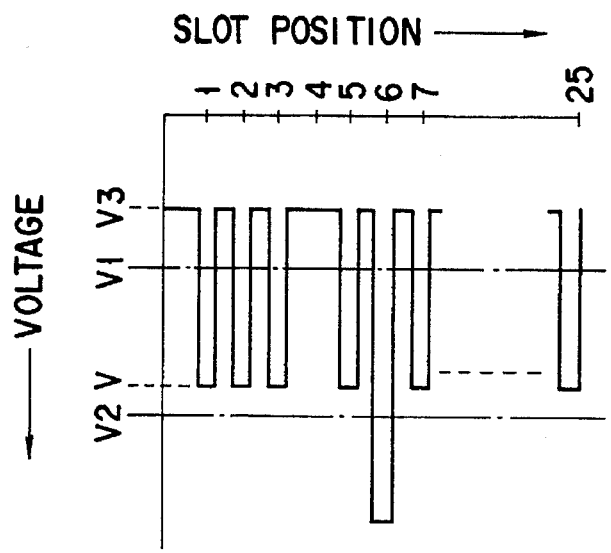
FIGS. 3A and 3B are illustrations for explaining the operation of the device of this embodiment.
Figure 3A:
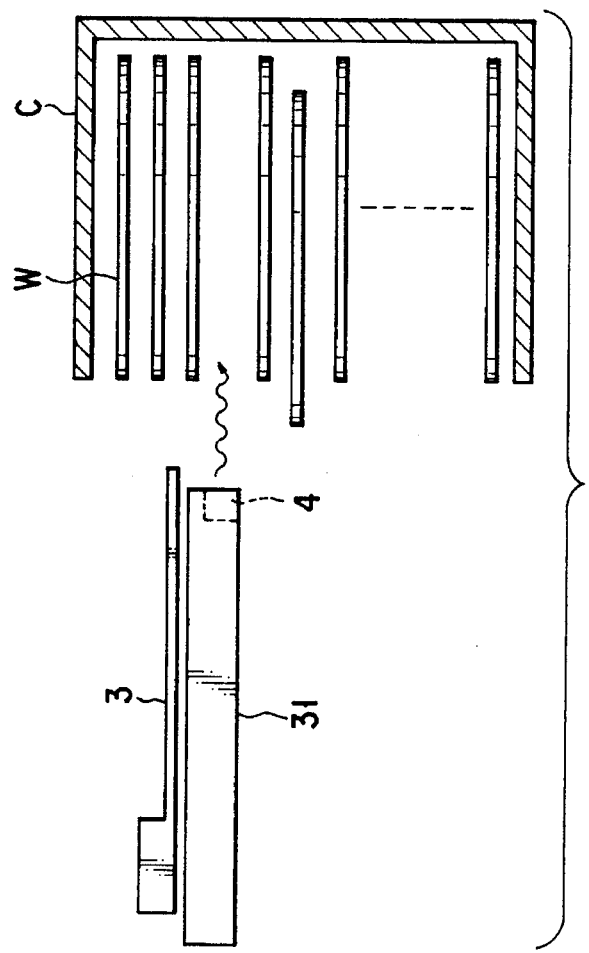

At this time, the oscillating section 4A continuously oscillates an ultrasonic wave forward. If a wafer W is present at a position opposing the oscillating section 4A, the ultrasonic wave is reflected by the end face of the wafer W and received by the receiving section 4B. The thickness of the wafer w is as small as about 0.7 mm. In order to accurately detect such wafer, the frequency of the ultrasonic wave is set to, e.g., 1 MHz. FIGS. 3A and 3B are illustrations showing the housing states of the wafers W in the carrier C and corresponding voltage signals output from the receiving section 4B through the amplifier 51. Numerical values 1 to 25 of FIG. 3B represent the slot numbers in the carrier C, and V1 and V2 are thresholds described above. In this example, a wafer W is absent in the fourth slot, and the wafer W of the sixth stage projects.

When the transfer mechanism 30 is moved downward from above the carrier C to below it to perform ultrasonic scanning, the output voltage V of the amplifier 51 becomes as shown in FIG. 3B. When a wafer W is correctly housed in the carrier C, the output voltage is between the thresholds V1 and V2, and thus the determination section 52 outputs information V representing "wafer is present". When a wafer W is absent as in the fourth stage, the output voltage is smaller than V1, and thus the determination section 52 outputs information representing "wafer is absent". When the wafer W projects from the carrier C as in the sixth stage, the determination section 52 outputs information representing "projection".

The position information output section 53 outputs information representing the height of the ultrasonic sensor 4 at this time, i.e., information representing the slot position in the carrier C. Thus, the data generating section 54 generates data indicating the presence/absence and projection of the wafer W in units of slots. The control unit 60 accesses this data. When projection of a wafer w is detected, the control unit 60 stops driving the transfer mechanism 30 and produces an alarm. Note that this operation can be performed in a hardware manner based on the output from the determination section 52, as described above.

When a wafer W does not project, the control unit 60 controls the motors 61 to 63 based on the above data, so that the wafer w is taken out from the carrier C. Regarding a slot having no wafer W, this slot is not accessed, and the next slot is accessed to take out the wafer W from it. To transfer a wafer W, the fork 3 is moved forward into the carrier C to a position slightly below the lower surface of the wafer W. Subsequently, the transfer mechanism 30 is moved upward to hold the wafer W on the fork 3. Then, the fork 3 is moved backward to take out the wafer W. The rotating table 31 is rotated to transfer the wafer W to a predetermined position, e.g., onto the wafer boat of an annealing device (not shown).

According to this embodiment, detection of the presence/absence and detection of projection of the wafer W at each stage of the carrier can be reliably performed simultaneously. Since the ultrasonic oscillating and receiving sections 4A and 4B are mounted to the transfer mechanism 30, sensors need not be arranged above and below or in front of and behind the carrier C to sandwich it. Thus, spaces for sensors need not be reserved around the carrier C. As should be apparent from FIG. 3B, the presence or absence of a wafer or target can also be determined by comparing the results of waves reflected from a wafer (e.g., at position 2) with that obtained at a location between targets or target locations (e.g., between positions 2 and 3 or between positions 3 and 4).

Figure 4:
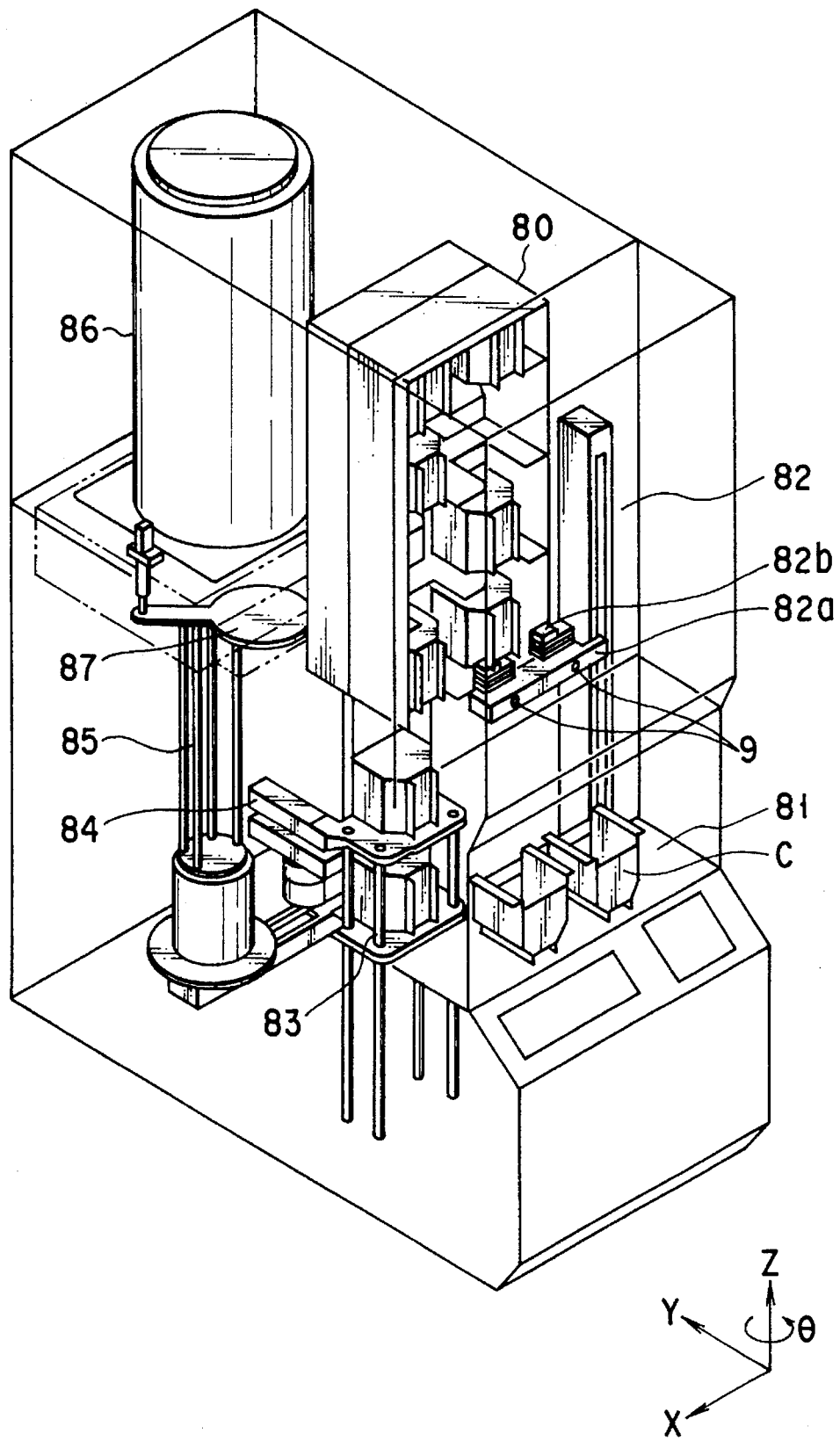
FIG. 4 is a schematic perspective view showing an annealing device using the transfer device of the present invention.

FIG. 4 shows an example of an annealing device using the transfer device of the present invention. In this annealing device, a carrier C placed on a carrier stage 81 is transferred to a wafer transfer unit 83 by a carrier moving unit 82, movable in X, θ, and Z directions, through a carrier housing shelf 80. The absence/projection of wafers in the carrier C on the wafer transfer unit 83 is detected by a wafer transfer device 84 having the same arrangement as that described in the above embodiment. Then, based on this detection data, the wafers are sequentially transferred to a wafer boat 85. When all the wafers are transferred, the wafer boat 85 is moved upward and guided into an annealing furnace 86 to anneal the wafers. After annealing, the wafer boat 85 is moved downward, and the annealed wafers are sequentially transferred into the carrier C on the wafer transfer unit 83 by the wafer transfer device. While transferring the annealed wafers from the wafer boat 85 to the carrier C, projection of the wafer from the wafer boat 85 may be detected by the transfer device 84. In this annealing device, the wafer boat 85 is sometimes tilted due to thermal deformation. The transfer device 84 according to the present invention can detect a tilt in the wafer boat 85 by measuring the distance between the upper end flange of the wafer boat 85 and the transfer device 84, and the distance between the lower end flange thereof and the transfer device 84. A detected tilt is informed to the operator immediately, so that a necessary countermeasure can be taken. Referring to FIG. 4, reference numeral 87 denotes a lid closing the opening in the lower end of the annealing furnace 86.

Furthermore, in the present invention, as shown in FIG. 4, ultrasonic sensors 9 identical to those described above may be provided to an elevating table 82*a* of a carrier transfer device, and the presence/absence and projection of the wafer in the carrier C may be detected by the ultrasonic sensors 9. More specifically, the carrier C placed on the carrier stage 81 is fallen aside at the back of the carrier stage 81 such that its opening (the opening in the upper surface of the carrier C in FIG. 4) opposes the carrier transfer device 82. Accordingly, when the elevating table 82*a* of the carrier transfer device 82 is moved downward to move the ultrasonic sensors 9 from above the carrier C to below it, the same detection as that described above can be performed in the same manner as in a case wherein the wafer transfer device is used. In FIG. 4, since the carrier transfer device 82 uses two transfer arms 82*b*, two carriers C can be transferred simultaneously. Two ultrasonic sensors 9 are also provided.

The transfer device according to the present invention can be applied also to a vacuum processing device and a resist processing device. The transfer target is not limited to a semiconductor wafer but can also be an LCD substrate. One ultrasonic section may be used both as ultrasonic oscillating and receiving sections. A change in oscillating state of the oscillating section caused by a reflected wave may be obtained to perform the detection described above.

As has been described above, according to the present invention, the ultrasonic oscillating and receiving sections are provided to the transfer device, and a reflected wave from the end face of a transfer target is received. Thus, the presence/absence and projection of a transfer target in each stage in the container can be simultaneously and reliably detected, and spaces for arranging sensors need not be reserved around an area for placing the container.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A transfer device comprising:

means for holding a plurality of plate-like transfer targets each having one end face facing in the same direction by disposing the transfer targets with predetermined gaps between each other in a direction of the end face;

an ultrasonic sensor having an oscillating section for oscillating an ultrasonic beam toward said holding means and a receiving section for receiving a reflected ultrasonic wave;

driving means for moving said ultrasonic sensor relative to said holding means in a direction along which the transfer targets are disposed so as to radiate an ultrasonic beam to the end faces of the transfer targets; and means for detecting at least one of the presence, absence, or projection of the transfer target in and from said holding means based on the reflected wave received by said receiving section;

wherein said driving means has an elevating table movable in the vertical direction, a rotating table supported by said elevating table to be rotatable within a horizontal plane and supporting said ultrasonic sensor at one end portion thereof, and a fork mounted to said rotating table to be linearly movable toward said holding means and capable of supporting a transfer target thereon.

2. A transfer device comprising:

means for holding a plurality of plate-like transfer targets each having one end face facing in the same direction by disposing the transfer targets with predetermined gaps between each other in a direction of the end face;

an ultrasonic sensor having an oscillating section for oscillating an ultrasonic beam toward said holding means and, a receiving section for receiving a reflected ultrasonic wave and for outputting a signal representative of the received ultrasonic wave;

driving means for moving said ultrasonic sensor relative to said holding means in a direction along which the transfer targets are disposed so as to radiate an ultrasonic beam to the end faces of the transfer targets; and means for detecting at least one of the presence, absence, or projection of the transfer target in and from said holding means based on the reflected wave received by said receiving section;

wherein said detecting means has determining means for comparing said output signal from said receiving section with at least one signal having a predetermined level, thereby determining at least one of the presence, absence, or projection of the transfer target, and means for controlling said driving means by a signal from said determining means.

3. A transfer device comprising:

means for holding a plurality of plate-like transfer targets each having one end face facing in the same direction by disposing the transfer targets with predetermined gaps between each other in a direction of the end face;

an ultrasonic sensor having an oscillating section for oscillating an ultrasonic beam toward said holding means and a receiving section for receiving a reflected ultrasonic wave;

driving means for moving said ultrasonic sensor relative to said holding means in a direction along which the transfer targets are disposed so as to radiate an ultrasonic beam to the end faces of the transfer targets; and means for detecting at least one of the presence, absence, or projection of the transfer target in and from said holding means based on the reflected wave received by said receiving section;

wherein said receiving section receives a first reflected wave of the ultrasonic wave from the end of the transfer target and a second reflected wave from a location between the transfer targets, and said detecting means detects the presence or absence of the transfer target in said holding means based on the first and second reflected waves received by said receiving means.

4. A transfer device comprising:

means for holing a plurality of plate-like transfer targets each having one end face facing in the same direction by disposing the transfer targets with predetermined gaps between each other in a direction of the end face;

an ultrasonic sensor having an oscillating section for oscillating an ultrasonic beam toward said holding means and a receiving section for receiving a reflected ultrasonic wave;

driving means for moving said ultrasonic sensor relative to said holding means in a direction along which the transfer targets are disposed so as to radiate an ultrasonic beam to the end faces of the transfer targets; and means for detecting at least one of the presence, absence, or projection of the transfer target in and from said holding means based on the reflected wave received by said receiving section;

wherein said receiving section receives reflected waves of ultrasonic waves from end faces of the respective transfer targets, and said detecting means compares the respective reflected waves received by said receiving section with a reference signal, thereby detecting projection of the transfer target in said holding means.

5. A device for transferring a plurality of plate-like transfer targets housed in respective stages in a container with gaps between each other in the vertical direction, comprising:

transfer means, having a holding member movable forward/backward and for holding and taking the transfer targets out from said container, and vertically movable relative to a placing section;

ultrasonic sensing means provided to said transfer means and having an oscillating section for oscillating an ultrasonic wave toward a front portion of said holding member and a receiving section for receiving a reflected wave of the ultrasonic wave and for outputting a signal representative of the received ultrasonic wave; and detecting means for detecting either the presence, the absence, or the projection of a transfer target in each stage in said container based on the reflected wave received by said receiving section;

wherein said detecting means has determining means and control means, said determining means comparing said output signal from said receiving section with a first signal having a first level and with a second signal having a second level higher than the first level, and determining that a transfer target is absent when the output signal has a level lower than the first level and that a transfer target projects when the output signal has a level higher than the second level, and said control means controlling said transfer means by a signal from said determining means.

6. A combination of:

a heating device having a vertical heating furnace for heating a semiconductor wafer, a boat, arranged below said heating furnace, capable of moving into said heating furnace, and capable of horizontally supporting a plurality of semiconductor wafers with predetermined gaps between each other in a direction of thickness, and a carrier, arranged on a side of said boat, capable of horizontally supporting a plurality of semiconductor wafers in respective slots therein with predetermined gaps between each other in the direction of thickness, and having an opening in a side thereof opposing said boat for loading and unloading semiconductor wafers therethrough; and a transfer device comprising vertically movable transfer means and ultrasonic sensing means, said transfer means having a holding member movable for holding the semiconductor wafers, taking out the semiconductor wafers to be heated from said carrier through the opening, transferring the semiconductor wafer to the boat, and transferring the heated semiconductor wafers from said boat into said carrier, and said ultrasonic sensing means being provided to said transfer means and having an oscillating section for oscillating an ultrasonic wave toward the opening in said carrier and a receiving section for receiving a reflected wave of the ultrasonic wave, and detecting means for detecting either the presence, the absence, or the projection of the semiconductor wafers in the respective slots of said carrier based on the reflected wave received by said receiving section.

7. A combination according to claim 6, wherein said boat has upper and lower flanges for supporting the semiconductor wafers therebetween, said ultrasonic sensing means oscillates the ultrasonic wave toward said flanges so as to measure a distance with respect to said flanges and is moved to upper and lower positions so that reflected waves of the ultrasonic wave from said flanges are received by said receiving section, and said detecting means detects a tilt in said boat based on the reflected wave received by said receiving section.

* * * * *